United States Patent
Kawamura

(10) Patent No.: US 11,362,580 B2
(45) Date of Patent: Jun. 14, 2022

(54) POWER CONVERSION DEVICE WITH TEMPERATURE CONTROL

(71) Applicant: Mitsubishi Electric Corporation, Tokyo (JP)

(72) Inventor: Mao Kawamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 44 days.

(21) Appl. No.: 16/965,886

(22) PCT Filed: Oct. 23, 2018

(86) PCT No.: PCT/JP2018/039349
§ 371 (c)(1),
(2) Date: Jul. 29, 2020

(87) PCT Pub. No.: WO2019/181040
PCT Pub. Date: Sep. 26, 2019

(65) Prior Publication Data
US 2021/0044209 A1 Feb. 11, 2021

(30) Foreign Application Priority Data
Mar. 22, 2018 (JP) .............................. JP2018-053924

(51) Int. Cl.
*H02M 1/32* (2007.01)
*H02M 3/335* (2006.01)
*B60L 3/00* (2019.01)

(52) U.S. Cl.
CPC ....... *H02M 1/327* (2021.05); *H02M 3/33507* (2013.01); *H02M 3/33569* (2013.01); *B60L 3/00* (2013.01)

(58) Field of Classification Search
CPC ........... H02M 1/327; H02M 1/32; H02H 5/04
See application file for complete search history.

(56) References Cited

U.S. PATENT DOCUMENTS

2003/0111984 A1  6/2003  Isham
2014/0321184 A1* 10/2014  Artelsmair ........... B23K 11/314
                                                          363/144
(Continued)

FOREIGN PATENT DOCUMENTS

EP    3 076 536 A1   10/2016
JP    2008-072818 A   3/2006
(Continued)

OTHER PUBLICATIONS

Communication dated Mar. 30, 2021 by the European Patent Office in application No. 18910628.9.
(Continued)

*Primary Examiner* — Alex Torres-Rivera
(74) *Attorney, Agent, or Firm* — Sughrue Mion, PLLC; Richard C. Turner

(57) ABSTRACT

In order to cause an output to be continued while protecting a DC-DC converter including a temperature detector from overheating, without stopping an operation or excessively reducing an output, even when an abnormality has occurred in a cooler or the temperature detector has failed, a controller sets current values at which a control using droop characteristics is started in a multiple of stages in accordance with temperature values, and carries out the control using droop characteristics by switching the current value in accordance with a temperature detected by the temperature detector.

13 Claims, 14 Drawing Sheets

(56) References Cited

U.S. PATENT DOCUMENTS

| | | | |
|---|---|---|---|
| 2015/0249391 A1 | 9/2015 | Yang et al. | |
| 2016/0301320 A1* | 10/2016 | Wakabayashi | H02M 3/33569 |
| 2019/0146026 A1* | 5/2019 | Kimura | G01R 31/2642 |
| | | | 324/750.03 |
| 2019/0348905 A1* | 11/2019 | Bae | H02M 7/48 |

FOREIGN PATENT DOCUMENTS

| | | |
|---|---|---|
| JP | 2006-278292 A | 10/2006 |
| JP | 2006-288070 A | 10/2006 |
| JP | 2008-113509 A | 5/2008 |
| JP | 2011-087407 A | 4/2011 |
| JP | 2017-79520 A | 4/2017 |
| WO | 2015/079572 A1 | 6/2015 |

OTHER PUBLICATIONS

International Search Report for PCT/JP2018/039349 dated Dec. 18, 2018 [PCT/ISA/210].
Written Opinion for PCT/JP2018/039349 dated Dec. 18, 2018 [PCT/ISA/237].
Japanese Opposition issued Jan. 17, 2021 in Japanese Application No. 2018-053924.

* cited by examiner

POWER CONVERSION DEVICE WITH TEMPERATURE CONTROL

CROSS REFERENCE TO RELATED APPLICATION

This application is a National Stage of International Application No. PCT/JP2018/039349 filed Oct. 23, 2018, claiming priority based on Japanese Patent Application No. 2018-053924 filed Mar. 22, 2018.

TECHNICAL FIELD

The present application relates to a power conversion device.

BACKGROUND ART

In the field of vehicle-mounted power supply systems, a two-battery type vehicle power supply device wherein a vehicle-mounted power supply system is configured of two batteries of differing voltages is used in a hybrid vehicle or a start-stop vehicle. The two-battery type vehicle power supply device is such that power to a high power load is supplied from a high voltage battery of several tens to several hundreds of volts, and power to a normal low voltage electrical load is supplied from an existing low voltage battery (an auxiliary battery, hereafter called a low voltage battery), such as a lead battery, of between ten and twenty volts. The high voltage battery is charged by a high voltage generating device, and the high voltage battery or the generating device is configured so as to supply power to the low voltage battery or the low voltage electrical load via a step-down DC-DC converter.

A semiconductor switching element is incorporated in the step-down DC-DC converter, and in order to supply power at a load system power supply voltage appropriate to charging the low voltage battery, feedback control of the semiconductor switching element is carried out so that an output voltage converges to a predetermined target value.

This kind of DC-DC converter is such that managing a temperature of the incorporated semiconductor switching element is important, and when, according to information relating to a detected temperature of the semiconductor switching element, the temperature of the semiconductor switching element enters an overheating region near a predetermined stopping temperature, overheating of the semiconductor switching element is suppressed by limiting an output current of the DC-DC converter, preventing the temperature of the semiconductor switching element from rising as far as the stopping temperature, and an operation of the semiconductor switching element is stopped when the temperature reaches the stopping temperature.

Also, it has been proposed that a power saving control causing an output voltage of a DC-DC converter to decrease should be executed when an output current becomes greater than a preset threshold in a power conversion device (Patent Literature 1). This is to protect a part included in the DC-DC converter from an effect of heat by limiting the output voltage when the output current becomes greater than the threshold.

CITATION LIST

Patent Literature

Patent Literature 1: JP-A-2011-87407

SUMMARY OF INVENTION

Technical Problem

A DC-DC converter having droop characteristics is such that an output voltage is limited in an overcurrent region, because of which a semiconductor switching element thereof reaching a stopping temperature can be prevented, and charging of a low voltage battery can be continued even when a state wherein the output of the DC-DC converter is limited is continued. Because of this, a problem wherein an engine starting performance of the low voltage battery worsens can be restricted.

However, when a temperature of cooling water that cools the DC-DC converter differs depending on a vehicle type, or when the cooling water temperature rises abruptly (for example, as an effect of heat generated when another component using the same cooling water as the DC-DC converter operates), there is concern that when a cooler abnormality occurs (for example, a water pump failure, water draining away due to a pipe crack, or the like, when a cooling method of the cooler is a water cooling method), a part will fail when relying only on output voltage limitation.

The present application, having been contrived in order to resolve the heretofore described problem, has an object of obtaining a power conversion device such that the power conversion device includes a temperature detector that detects a temperature of a DC-DC converter, and a realization of a reduction in size and a reduction in cost is achieved by restricting an increase in specifications of a constituent component of the power conversion device, while appropriately protecting the constituent component from overheating. Also, the present application has an object of providing a power conversion device including a control method such that a low voltage battery can be appropriately charged without an operation stopping, even when the temperature detector fails.

Solution to Problem

A power conversion device according to the present application is characterized by including a DC-DC converter that reduces and outputs an input power, a current detector that detects a value of a current output by the DC-DC converter, a temperature detector that detects a temperature of the DC-DC converter, and a controller that sets current values at which a control using droop characteristics is started in a multiple of stages in accordance with temperature values, and carries out the control by switching the setting value in accordance with the temperature detected by the temperature detector.

Advantageous Effects of Invention

According to the power conversion device disclosed in the present application, a constituent part of the power conversion device can be appropriately protected from overheating by a current value at which a control using droop characteristics is started (a start current value) being appropriately changed in accordance with a state of a temperature of a DC-DC converter, and the DC-DC converter can output by an operation being continued as far as a temperature state slightly before needing to stop due to overheating, because of which a total energy balance is efficient.

DESCRIPTION OF EMBODIMENTS

Figure 1:
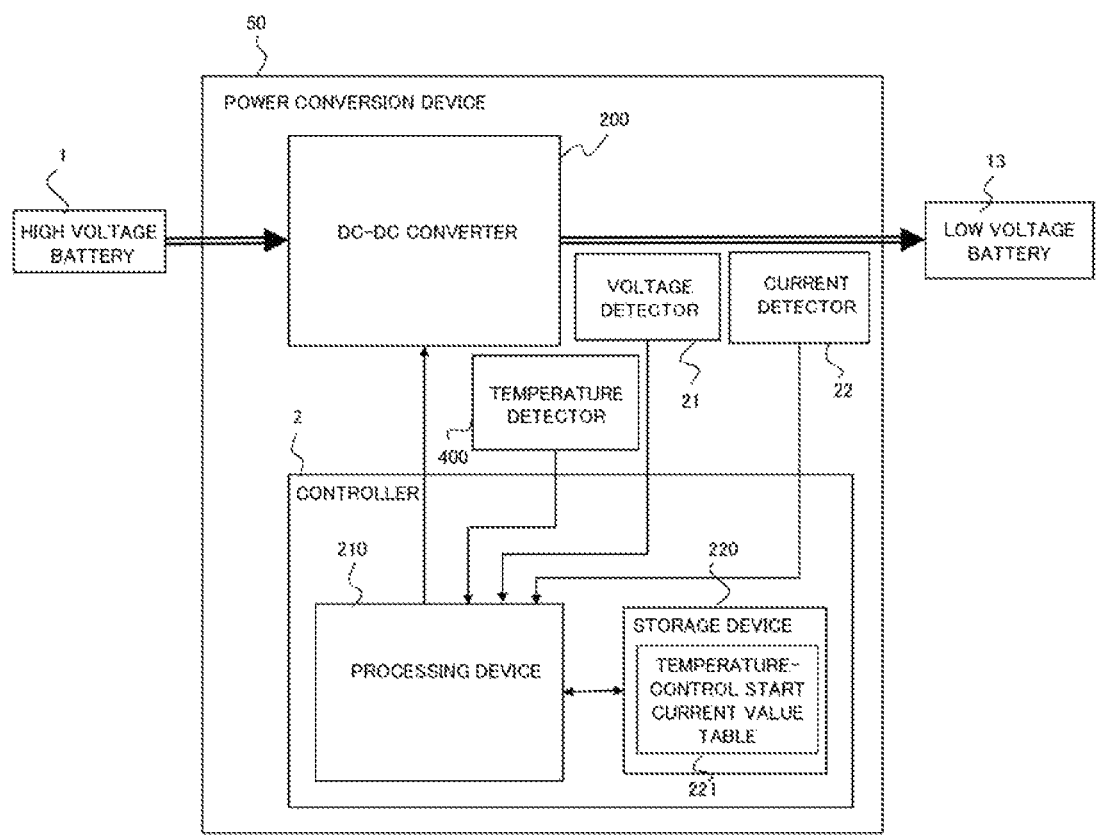
FIG. 1 is a schematic configuration diagram of a power conversion device according to a first embodiment of the present application.

Hereafter, using the drawings, preferred embodiments of a power conversion device according to the present application will be described. Identical reference signs are allotted to identical or corresponding portions in the drawings, and a redundant description will be omitted.

First Embodiment

Hereafter, a schematic configuration of a power conversion device according to a first embodiment of the present application is shown in FIG. 1. In the first embodiment, a high voltage battery 1 is connected to an input of a power conversion device 50, and a low voltage battery 13 is connected to an output, as shown in the drawing. A configuration is such that high voltage power input into the power conversion device 50 is reduced by a DC-DC converter 200, and low voltage power is output. A voltage value of the output of the DC-DC converter 200 is measured by a voltage detector 21, and a current value of the output is measured by a current detector 22. Also, a temperature of the DC-DC converter 200 is measured by a temperature detector 400, and the measurement value is sent to a controller 2.

The controller 2 includes a processing device 210 and a storage device 220. Although details of the storage device 220 are not shown in the drawing, the storage device 220 includes a volatile storage device such as a random access memory and a non-volatile auxiliary storage device such as a flash memory. Also, the storage device 220 may include a hard disk auxiliary storage device instead of a flash memory. The processing device 210 executes a program input from the storage device 220. In this case, the program is input from the auxiliary storage device into the processing device 210 via the volatile storage device. Also, the processing device 210 may output data such as a computation result to the volatile storage device of the storage device 220, or may save the data in the auxiliary storage device via the volatile storage device. The processing device 210 receives results of measurements by the voltage detector 21, the current detector 22, and the temperature detector 400, and uses the results as parameters when controlling so that an output of the DC-DC converter 200 nears a target value. The processing device 210 controls a switching operation of the DC-DC converter 200 so as to carry out a control using droop characteristics in accordance with a temperature state of the DC-DC converter 200. With regard to a current value that determines a start of the control using droop characteristics (a start current value), a table 221 that establishes a relationship between temperature and control start current value is included in the storage device 220, a start current value that accords with the temperature value is selected and switched to for use, and the droop control is started at the current value that accords with the temperature value. That is, a current value that accords with a temperature is recorded as a setting value in the table 221, the value of a detected temperature is collated against the table, and the current value that accords with the temperature value is called up.

Figure 2:
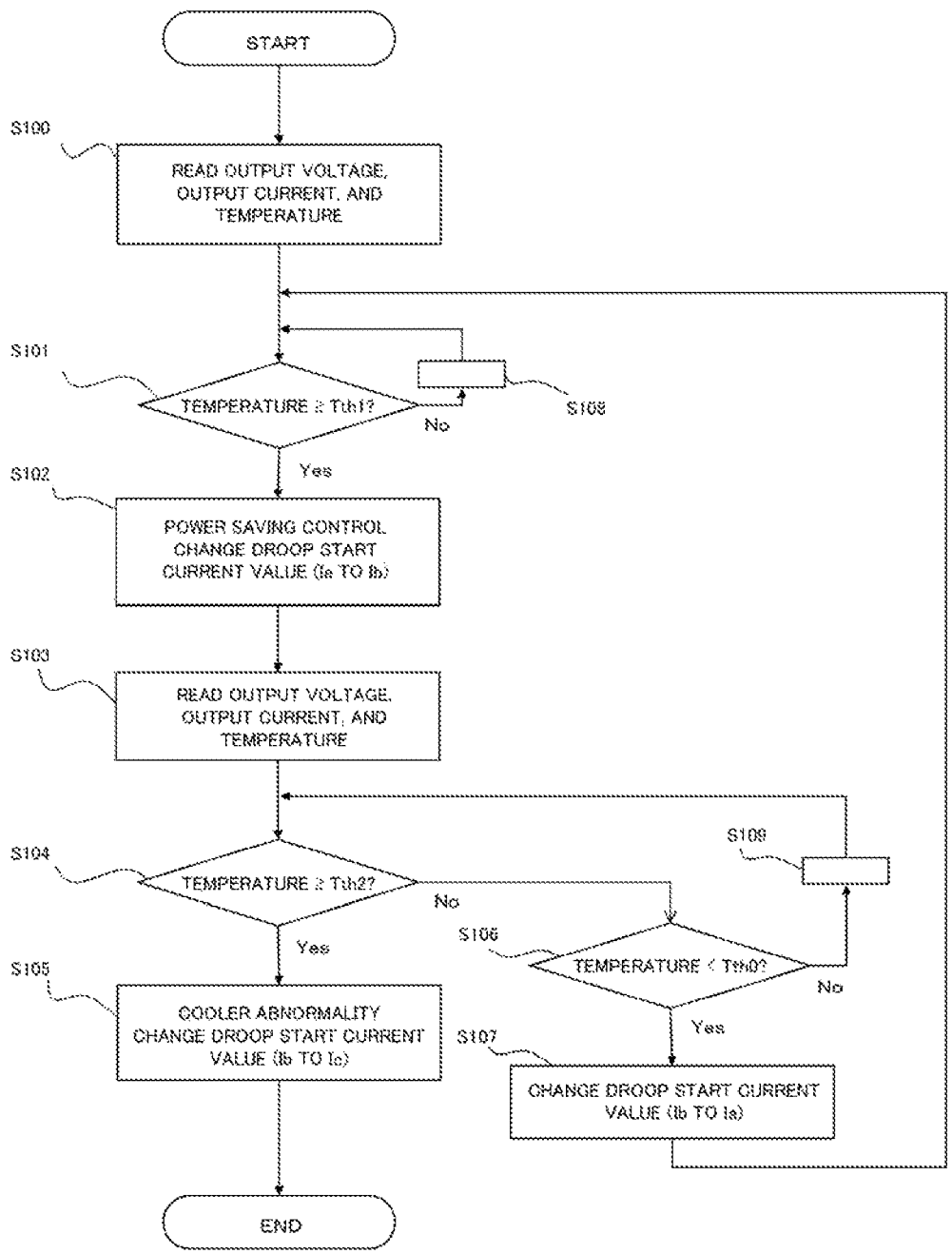
FIG. 2 is a flowchart showing a process of a control executed by a controller of the power conversion device according to the first embodiment of the present application.

Next, referring to FIG. 2, a control structure of a program executed by the controller 2, which is the power conversion device according to this embodiment, will be described. A routine shown in FIG. 2 is executed every preset sampling time.

In step (hereafter, "step" will be written as "S") 100, the controller 2 reads an output voltage, an output current, and a sensor temperature. The sensor temperature is a temperature detected by the temperature detector 400 shown in FIG. 1. After reading the output voltage, the output current, and the sensor temperature, the controller may, for example, execute an averaging process of calculating an average value of each preset time.

In S101, the controller 2 determines whether or not the temperature sensor value is exceeding a first threshold Tth1. When the temperature sensor value is equal to or greater than the first threshold Tth1 (YES in S101), the process is shifted to S102, and a power saving control is executed. The power saving control is a control method whereby the controller 2 reduces a droop start current by providing the output current with a predetermined gradient in order to improve a total energy balance of the low voltage battery 13. Herein, when the temperature sensor value is less than the first threshold Tth1 (in the case of NO in S101), the process is returned to S101.

In S103, the controller 2 reads the output voltage, the output current, and the sensor temperature during the power saving control. Next, in S104, the controller 2 determines whether or not the temperature sensor value is exceeding a second threshold Tth2. When the temperature sensor value is equal to or greater than the second threshold Tth2 (YES in S104), the process is shifted to S105. In S105, it is determined that there is a cooler abnormality, and the controller 2 switches the droop control start current from a second setting value Ib to a third setting value Ic in order to restrict the output current. For example, when the value of a temperature detected by the temperature detector exceeds the first threshold Tth1, the current value at which a control using droop characteristics is started is switched to a second setting value smaller than a first setting value Ia.

Meanwhile, when the temperature sensor value is less than the second threshold Tth2 in S104 (in the case of NO in S104), the process is shifted to S106. Next, in S106, the controller 2 determines whether or not the temperature sensor value is less than a threshold Tth0. When the temperature sensor value is less than the threshold Tth0 in S106 (in the case of YES in S106), the process is shifted to S107. In S107, the controller 2 determines that the cooler has returned to normal, and the droop control start current value is returned from the second setting value Ib to the first setting value Ia. Also, when the temperature sensor value is equal to or greater than the threshold Tth0 in S106 (in the case of NO in S106), the process is returned to S106. When the temperature sensor value is less than the first threshold Tth1 in S101, the process is returned to the process of S101, but when doing so, the number of repeats is counted in S108, and used to confirm that the device is operating in a stable state. Also, the number of repeats of the processes of S104 to S106 are counted in the same way in S109, whereby a confirmation of a normal state when sampling is carried out.

Figure 3:
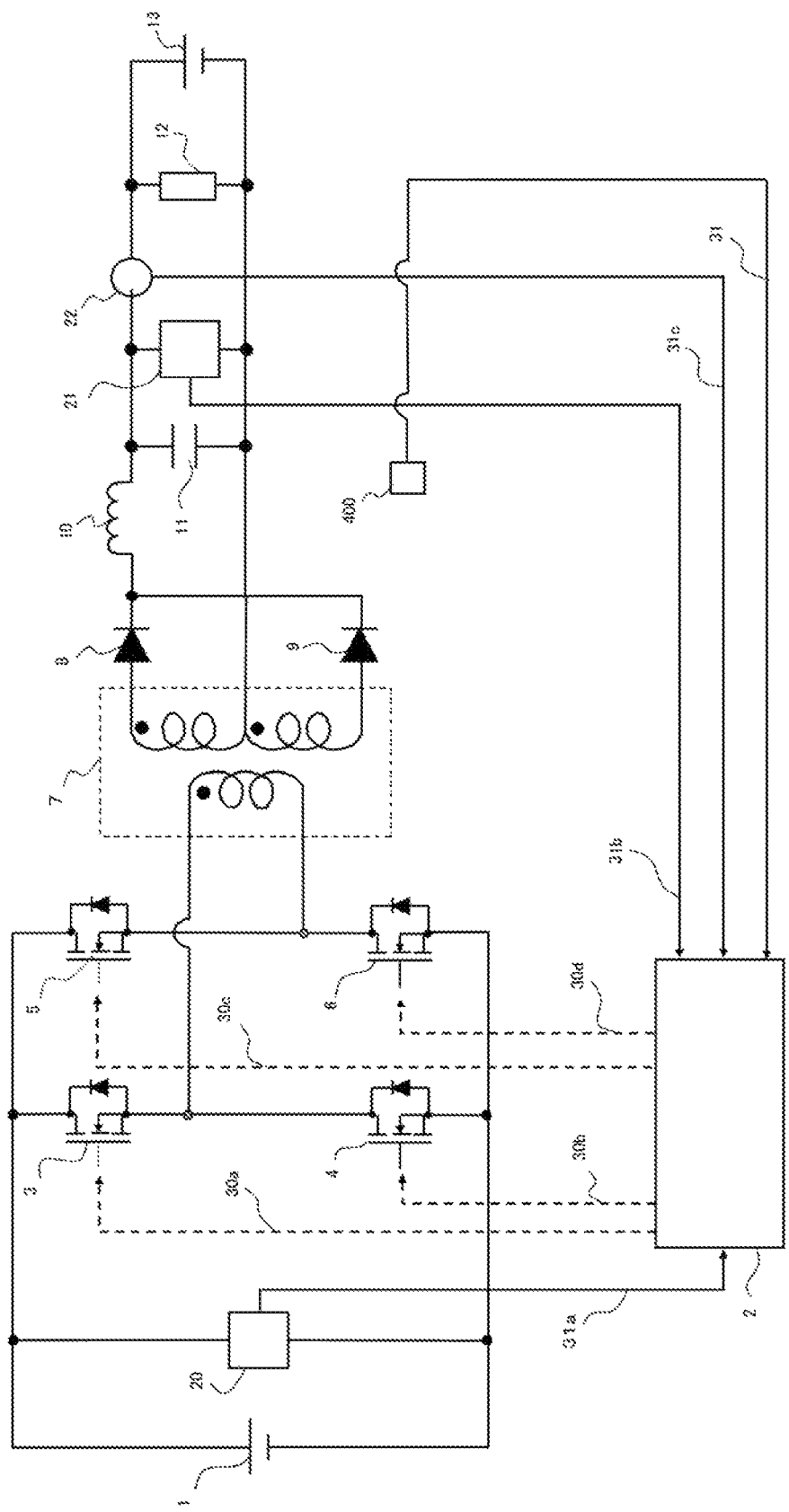
FIG. 3 is a schematic circuit diagram of the power conversion device according to the first embodiment of the present application.
Figure 4A:
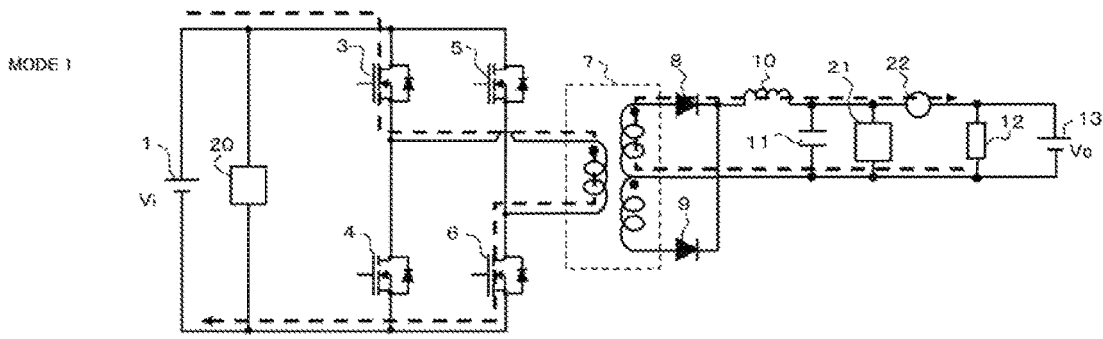
FIG. 4A is a drawing for illustrating mode 1 of semiconductor switching element switching modes of the power conversion device according to the first embodiment of the present application.
Figure 4B:
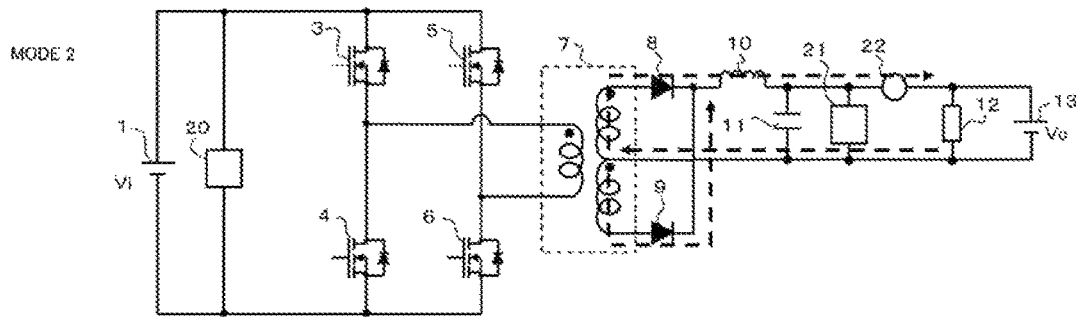
FIG. 4B is a drawing for illustrating mode 2 of the semiconductor switching element switching modes of the power conversion device according to the first embodiment of the present application.
Figure 4C:
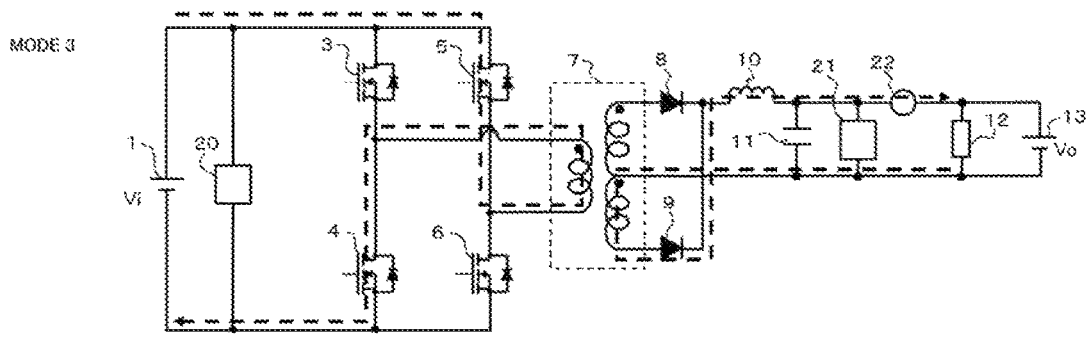
FIG. 4C is a drawing for illustrating mode 3 of the semiconductor switching element switching modes of the power conversion device according to the first embodiment of the present application.
Figure 4D:
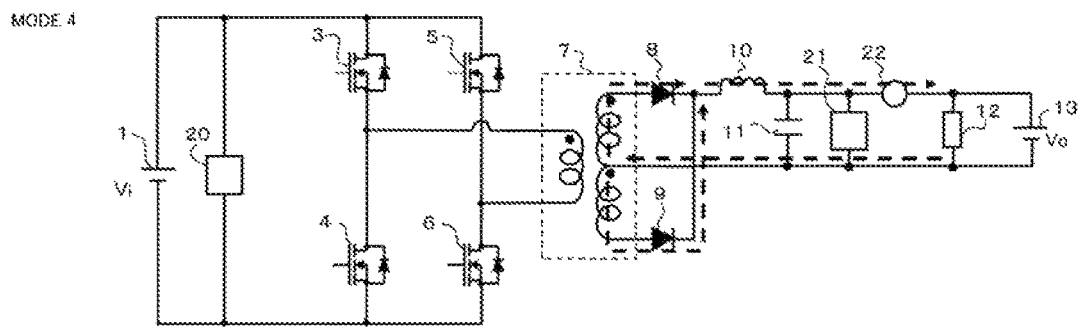
FIG. 4D is a drawing for illustrating mode 4 of the semiconductor switching element switching modes of the power conversion device according to the first embodiment of the present application.

Next, a schematic circuit configuration will be described. FIG. 3 represents a circuit of the insulated DC-DC converter 200 according to the first embodiment of the present application. In FIG. 3, the DC-DC converter 200 is configured of elements from the high voltage battery 1 of an input unit to a load 12 and the low voltage battery 13 on an output side. Four semiconductor switching elements 3, 4, 5, and 6 are connected on a subsequent stage side of the high voltage battery 1. MOSFETs, for example, are used as the semiconductor switching elements. The controller 2 drives the semiconductor switching elements 3, 4, 5, and 6 so as to be turned on and off via control lines 30a, 30b, 30c, and 30d. A connection point of a source of the semiconductor switching element 3 and a drain of the semiconductor switching element 4 is connected to a primary winding of a transformer 7, and another end is connected to a connection point of a source of the semiconductor switching element 5 and a drain of the semiconductor switching element 6. The transformer 7 is an insulated transformer.

Also, an input voltage detector 20 is connected in parallel with the high voltage battery 1.

Rectifying diodes 8 and 9 are connected to a secondary winding of the transformer 7. A smoothing reactor 10 and a smoothing capacitor 11 are connected in a stage subsequent to the diodes 8 and 9 for secondary side rectifying. Furthermore, the current detector 22 is connected in series in a stage subsequent to the smoothing reactor 10, and the voltage detector 21 is connected in parallel to the load 12. Also, a temperature sensor SnsTL is included in an interior of the DC-DC converter 200, and the controller 2 acquires voltage, current, and temperature information via signal lines 31a, 31b, 31c, and 31d. Herein, when the power conversion device 50 is applied to an electric vehicle or a hybrid vehicle, the high voltage battery 1 is typically formed of a rechargeable battery such as a nickel-hydrogen battery or a lithium ion battery. The voltage of the high voltage battery 1 is at least 100V.

A basic operation of the DC-DC converter 200 including this kind of circuit will be described using FIG. 4A, FIG. 4B, FIG. 4C, FIG. 4D, and FIG. 5. The DC-DC converter 200 of this embodiment is such that the four operating modes shown in FIG. 4A, FIG. 4B, FIG. 4C, and FIG. 4D exist in accordance with a state of each of the semiconductor switching elements 3, 4, 5, and 6.

In mode 1, the semiconductor switching element 3 and the semiconductor switching element 6 are in an on-state, and the semiconductor switching element 4 and the semiconductor switching element 5 are in an off-state. In this case, current flowing on the primary winding side of the transformer 7 flows along a route from the high voltage battery 1 through the semiconductor switching element 3, the transformer 7 (the primary winding side), and the semiconductor switching element 6. Herein, the transformer 7 transmits power from a primary side to a secondary side, and current flowing on the secondary winding side of the transformer 7 flows along a route from the transformer 7 (the secondary winding side) through the rectifying diode 8, the smoothing reactor 10, and the external load 12.

In mode 2, all of the semiconductor switching elements 3, 4, 5, and 6 are in an off-state. In this case, no current flows on the primary side of the transformer 7, and no power is transmitted to the secondary side. However, owing to self-inductance of the smoothing reactor 10, current flows on the secondary side of the transformer 7 along a route from the smoothing reactor 10 through the external load 12, the transformer 7 (the secondary winding side), and the rectifying diodes 8 and 9 to the smoothing reactor 10.

In mode 3, the semiconductor switching element 3 and the semiconductor switching element 6 are in an off-state, and the semiconductor switching element 4 and the semiconductor switching element 5 are in an on-state. In this case, current flowing on the primary winding side of the transformer 7 flows along a route from the high voltage battery 1 through the semiconductor switching element 5, the transformer 7 (the primary winding side), and the semiconductor switching element 4. Herein, the transformer 7 transmits power from the primary side to the secondary side, and current flowing on the secondary winding side of the transformer 7 flows along a route from the transformer 7 (the secondary winding side) through the rectifying diode 9, the smoothing reactor 10, and the external load 12.

In mode 4, all of the semiconductor switching elements 3, 4, 5, and 6 are in an off-state. In this case, no current flows on the primary side of the transformer 7, and no power is transmitted to the secondary side. However, owing to self-inductance of the smoothing reactor 10, current flows on the secondary side along a route from the smoothing reactor 10 through the external load 12, the transformer 7 (the secondary winding side), and the rectifying diodes 8 and 9 to the smoothing reactor 10.

Figure 5:
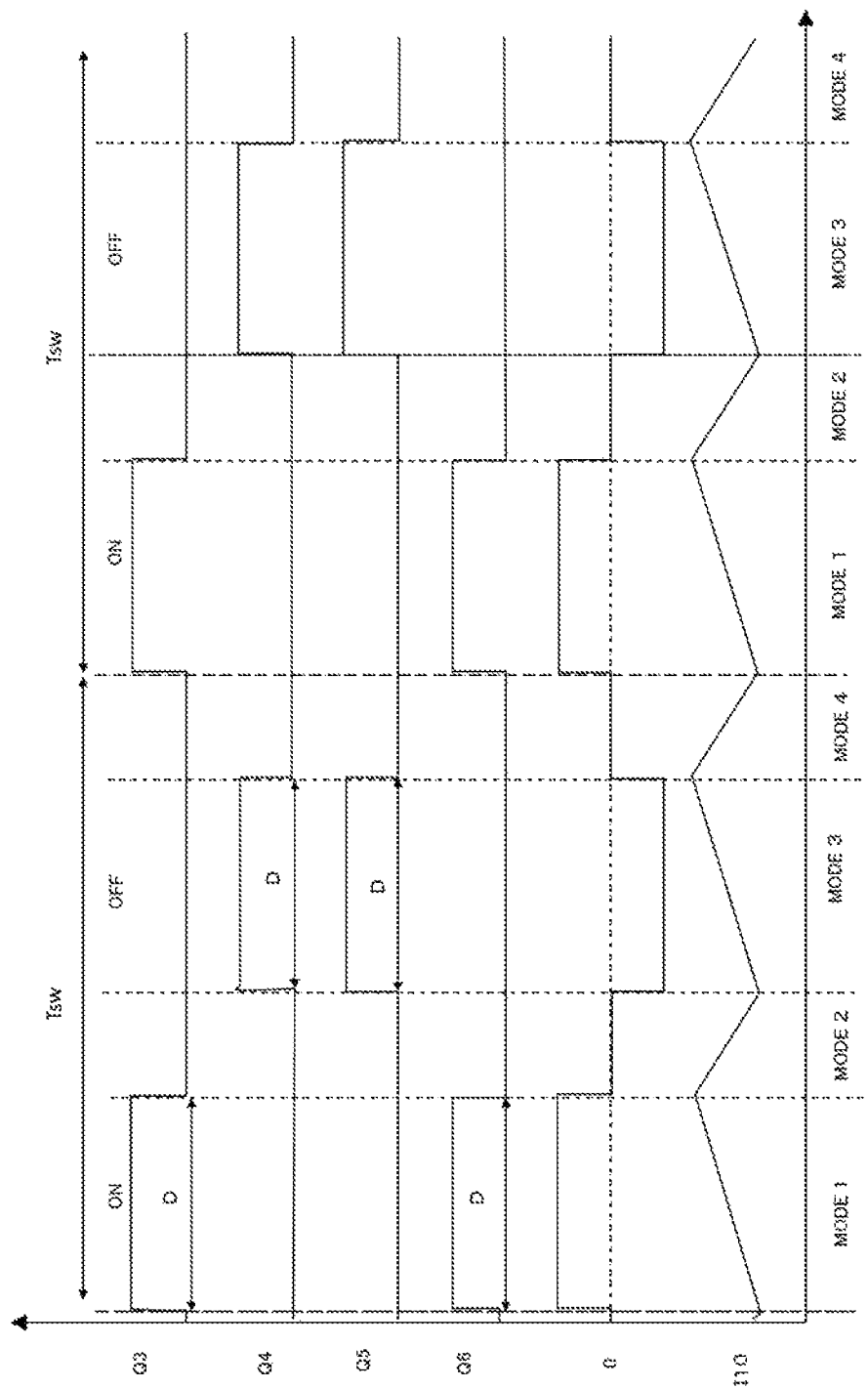
FIG. 5 is a drawing showing a time chart of a signal in each unit and a current in the power conversion device according to the first embodiment of the present application.

After mode 4 ends, there is a return to mode 1, and mode 1 to mode 4 are repeated. Of the current flowing into the smoothing reactor 10 in each mode, an alternating current component flows through the smoothing capacitor 11. FIG. 5 shows a time chart of signals Q3, Q4, Q5, and Q6 in the semiconductor switching elements 3, 4, 5, and 6 of the power conversion device according to the first embodiment of the present application and a current I10 flowing into the smoothing reactor 10.

The controller 2, while causing the semiconductor switching elements 3, 4, 5, and 6 to be turned on and off in this way, controls a desired output voltage by adjusting a duty cycle (D) range of the semiconductor switching elements.

The power conversion device of the first embodiment having the heretofore described kind of configuration is such that when the output current becomes greater than a threshold, the controller 2 executes a power saving control that causes the output voltage of the DC-DC converter 200 to decrease. By limiting the output voltage when the output current becomes greater than the threshold, a part included in the DC-DC converter 200 can be protected from an effect of heat. When the power conversion device is applied to an electric vehicle or a hybrid vehicle, factors in the output current increasing beyond a rated current are, for example, a case wherein a PTC (positive temperature coefficient) heater is caused to operate, a case wherein an electrical part other than a genuine part (for example, an illumination or an immobilizer) is added by a user, or, in addition to the heretofore described cases, a case wherein a drive torque greater than that for normal travel is needed, such as when traveling uphill for a long time.

Figure 6:
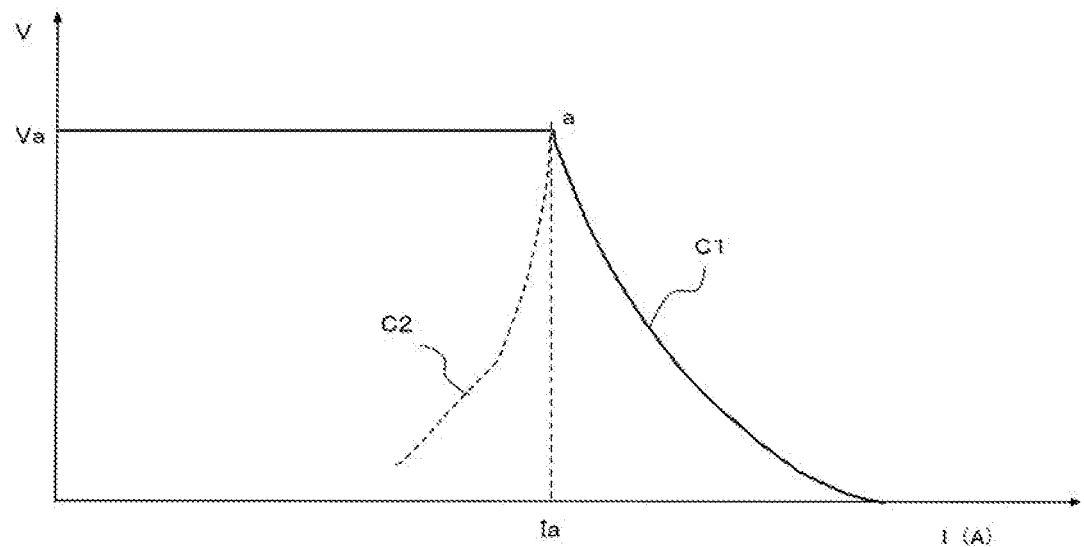
FIG. 6 is a drawing showing a relationship between an output current and an output voltage of a DC-DC converter.

When an excessive current flows, the controller 2 provides droop characteristics such that restrict an excessive output by lowering the voltage, as shown in FIG. 6. A vertical axis of FIG. 6 shows output voltage (V), and a horizontal axis of FIG. 6 shows output current (I). Herein, droop characteristics are described as a curve C1, but not being limited to this, the droop characteristics may also be, for example, characteristics of a curve C2 shown as a broken line.

The controller 2 envisages a case wherein, for example, an upper limit voltage Va set when charging the low voltage battery 13 is set as an output voltage target value. The controller 2 controls the DC-DC converter 200 so that the upper limit voltage Va the same as the target voltage is output until the output current increases as far as the first setting value Ia, as shown in FIG. 6. Next, when the output current is greater than the first setting value Ia, the controller 2 sets a value smaller than the upper limit voltage Va as the target voltage, and controls the DC-DC converter 200 so that the output voltage becomes smaller than Va.

Figure 7:
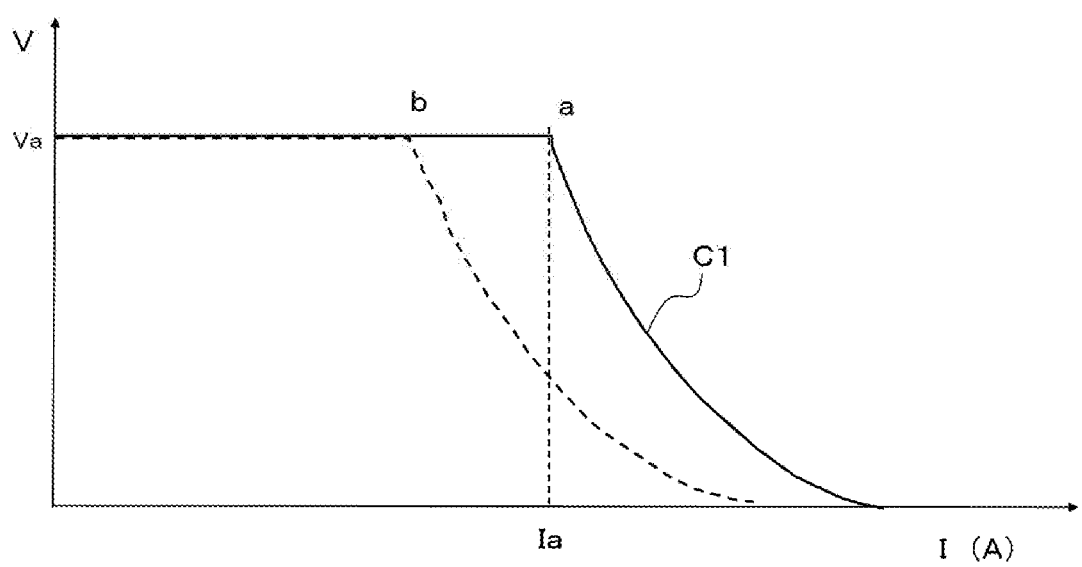
FIG. 7 is a drawing showing a relationship between the output voltage and the output current in the power conversion device according to the first embodiment of the present application.

Owing to the heretofore described power saving control, a part included in the DC-DC converter is protected from an effect of heat, but when, for example, a temperature of water entering the cooler is higher than envisaged, there is a possibility of a part failing due to a heat generating abnormality even at an output current not subject to droop control (<first setting value Ia). Because of this, the power conversion device according to the first embodiment is such that the temperature sensor SnsTL is included in the DC-DC converter 200, and when the value of the temperature sensor SnsTL exceeds a predetermined temperature, the controller 2 determines that there is a cooling water temperature abnormality, and lowers the droop control start current value (to the second setting value Ib). A relationship between the output voltage and the output current at this time is shown in FIG. 7. Also, FIG. 8 shows a time chart of the temperature sensor value and the output current in the power conversion device according to the first embodiment of the present application.

Figure 8:
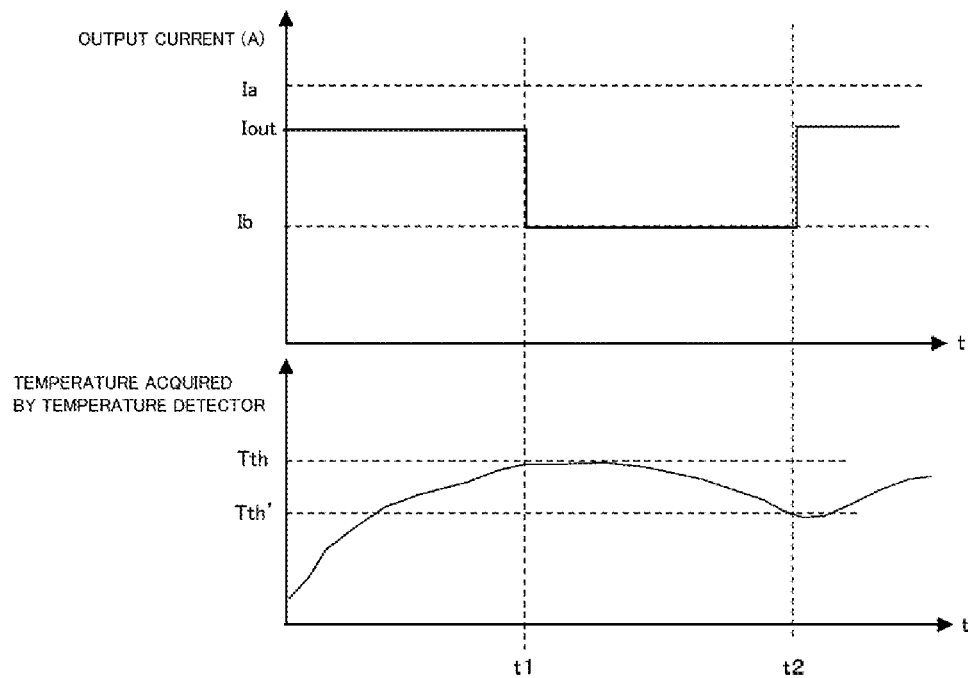
FIG. 8 is a drawing showing a time chart of a temperature sensor value and the output current in the power conversion device according to the first embodiment of the present application.

A case wherein an output current Iout of the DC-DC converter 200 is equal to or less than the first setting value Ia of the droop start current, and not subject to power saving control, is envisaged from FIG. 8. In this case, the temperature of the temperature sensor SnsTL increases when an abnormality occurs in the cooler. In this case, the controller 2 changes the droop control start current from the first setting value Ia to the second setting value Ib when the temperature of the temperature sensor SnsTL exceeds a threshold Tth, and the output current drops from Iout to the second setting value Ib. Because of this, a part included in the DC-DC converter can be protected from an effect of heat even when an abnormality occurs in the cooler. Next, when the temperature detected by the temperature sensor SnsTL during the power saving operation drops below Tth', the controller 2 is such that the droop start current returns from the second setting value Ib to the first setting value Ia, and the power saving control is stopped.

Second Embodiment

A power conversion device in a second embodiment will be described. A circuit configuration of the power conversion device of the second embodiment is the same as that in the first embodiment. In order to detect the temperature of a secondary side rectifying circuit, that is, the rectifying diodes 8 and 9, the temperature sensor SnsTL of the power conversion device of the second embodiment is installed in a vicinity of the rectifying diodes.

When the DC-DC converter 200 of the power conversion device in the second embodiment is applied to an electric vehicle or a hybrid vehicle, a lithium ion battery is connected as the high voltage battery 1, and a lead battery is connected as the low voltage battery 13. A voltage range of a lithium ion battery is large in comparison with that of a lead battery. This means that even under the same load conditions (the same output current), an input current of the DC-DC converter differs depending on the voltage of the high voltage battery 1, because of which loss also differs. That is, when the temperature sensor SnsTL monitors a temperature on the primary side of the transformer 7, for example, the temperature of one of the semiconductor switching elements 3, 4, 5, or 6, the monitored temperature changes in accordance with the input voltage, even under the same load conditions. Because of this, a temperature threshold (Tth) having leeway with respect to worst conditions must be set, because of which design is excessive, and a part cost increases.

Meanwhile, on the secondary side of the transformer 7, it is known that as there is little voltage fluctuation in the low voltage battery 13, as which a lead battery is connected, loss in the rectifying diodes 8 and 9 is uniquely determined in accordance with load conditions, and there is a correlation between the output current and the rectifying diode temperature. Because of this, the power conversion device in the second embodiment is such that even when the temperature sensor SnsTL is limited to detecting the temperature of the rectifying diodes 8 and 9, the same advantages as in the first embodiment are obtained, in addition to which an advantage is achieved in that a quantity of temperature sensors, thermistors for example, can be reduced, whereby cost is reduced.

Herein, although main circuit parts on the secondary side of the transformer 7 also include the smoothing reactor 10, the smoothing capacitor 11, and the like, parts detected by the temperature sensor SnsTL are desirably the rectifying diodes 8 and 9. This is because a diode generally has a small heat capacity compared with that of a capacitor or a reactor. For example, when an abnormality occurs in the cooler, a temperature rise is fast when the heat capacity is small, because of which detecting the rectifying diode temperature here enables the abnormality to be noticed quickly. Conversely, when the temperature of the smoothing reactor 10 is monitored, a temperature rise is slow compared with that of a diode, meaning that when the controller 2 detects the abnormality from a temperature acquired from the temperature sensor SnsTL, there is a possibility that the temperature of the rectifying diodes 8 and 9 is already high, and that the parts will fail.

Third Embodiment

A power conversion device in a third embodiment will be described. A circuit configuration of the power conversion device of the third embodiment is the same as that in the second embodiment. The power conversion device of the third embodiment is characterized in that the temperature sensor SnsTL is included in the interior of the DC-DC converter, and the temperature sensor SnsTL monitors the temperature of the rectifying diodes 8 and 9, but the diode temperature is desirably that of the place in which the most heat is generated. For example, it is assumed that junction temperatures of a rectifying diode and a semiconductor switching element are both 150° C. In this case, assuming that the temperature of the semiconductor switching element reaches 150° C. when the temperature of the rectifying diode is 140° C. when the DC-DC converter is operating under predetermined load conditions, there is a possibility of the temperature of the semiconductor switching element exceeding 150° C., and failure occurring, unless the controller 2 of the power conversion device of the second embodiment stops the operation before the value of the temperature detected by the temperature sensor SnsTL reaches 140° C. That is, even though the capability as a rectifying diode is up to 150° C., the rectifying diode can only be used at 140° C. or less. In the same way, when there is another place in which the most heat is generated, the temperature threshold Tth of the temperature sensor SnsTL is determined in accordance with the load conditions when the temperature of the part is at the upper limit.

Herein, the power conversion device according to the third embodiment is such that when designing so that a rectifying diode is the place in which the most heat is generated, temperature detected by the temperature sensor SnsTL is such that the controller 2 needs only to monitor the temperature state of the rectifying diode, and there is no setting of a temperature threshold in accordance with another part, because of which the part can be used with no leeway. Because of this, the same advantages as in the second embodiment are obtained with the power conversion device according to the third embodiment, in addition to which a part can be used to the limit, because of which an advantage is achieved in that a wasteful cost increase is restricted.

Fourth Embodiment

Figure 9:
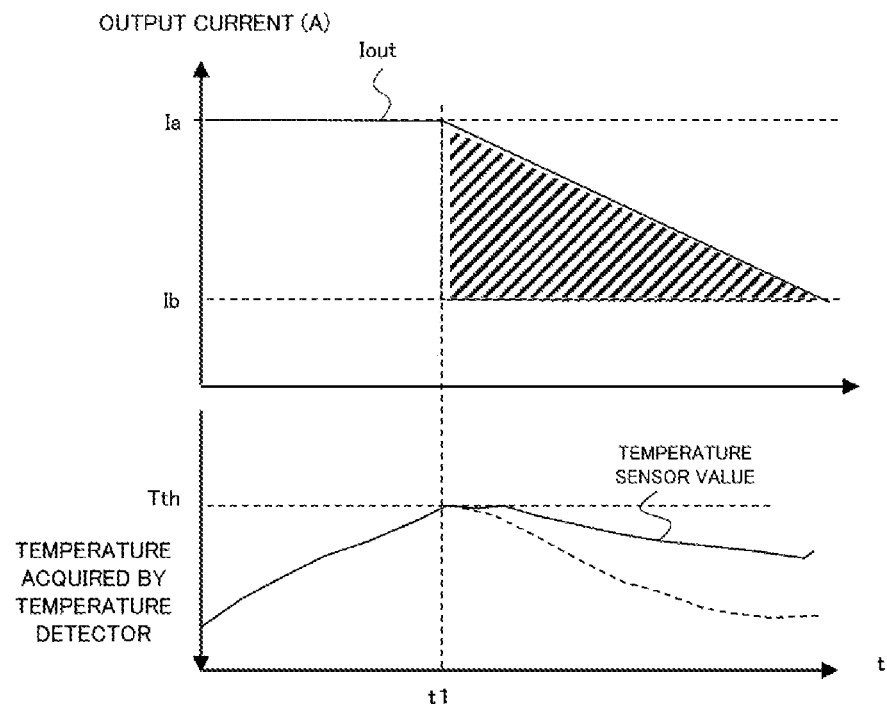
FIG. 9 is a drawing showing a time chart of the temperature sensor value and the output current in a power conversion device according to a fourth embodiment of the present application.

A power conversion device in a fourth embodiment will be described. A circuit configuration of the power conversion device of the fourth embodiment is the same as that in the first embodiment. The power conversion device of the fourth embodiment is such that the power saving control described in the first embodiment differs. FIG. 9 shows a time chart of the temperature sensor value and the output current in the power conversion device according to the fourth embodiment of the present application. A broken line is the droop current value switching method when using the power saving control described in the first embodiment. When the temperature acquired using the temperature sensor SnsTL exceeds the predetermined threshold (Tth), an amount of energy equivalent to the area of a hatched region of FIG. 9 can be effectively output by the controller 2 of the power conversion device of the fourth embodiment providing sweep characteristics that provide a predetermined gradient (A/s) to an output current change speed, rather than carrying out a control reducing the output current so that the droop start current drops immediately from the first setting value Ia to the second setting value Ib, as shown in the first embodiment.

From FIG. 9, it is understood that by causing the output current to decrease by providing the current change speed with a predetermined gradient, power can be effectively supplied to the battery side using the droop current switching described in the first embodiment, while protecting a part. That is, when considered in terms of the low voltage battery 13, the total energy balance of the power saving control of the power conversion device of the fourth embodiment is improved, and can be more effectively utilized.

Figure 10:
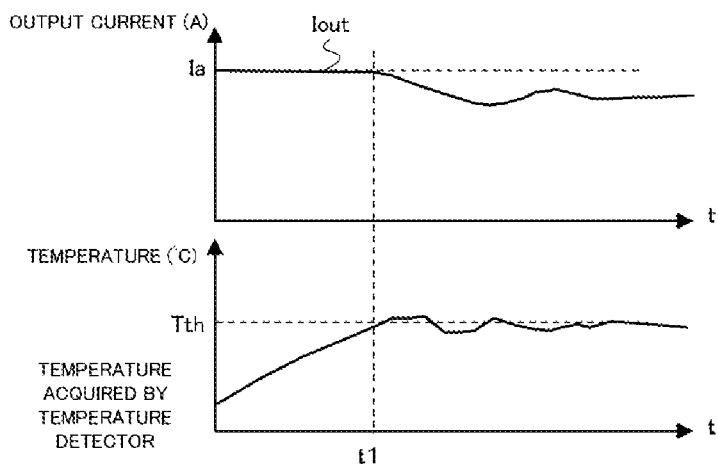
FIG. 10A is a drawing showing a time chart of the temperature sensor value and the output current in a modification of the power conversion device according to the fourth embodiment of the present application.
FIG. 10B is an illustration showing a relationship between a cooler cooling water temperature and the output current in the modification of the power conversion device according to the fourth embodiment of the present application.
Figure 10B:
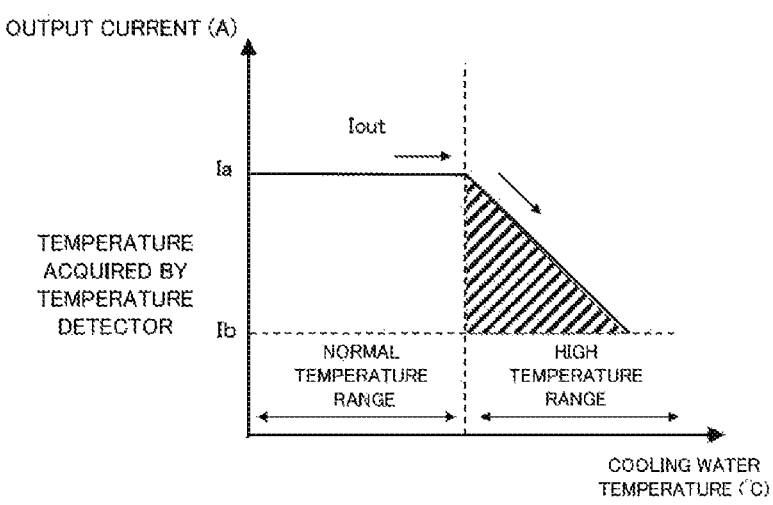

A power saving control method whereby the controller 2 reduces the droop start current by providing the output current with a predetermined gradient in order to improve the total energy balance of the low voltage battery 13 has been described in the fourth embodiment, but not being limited to this, it is good when output from the temperature sensor SnsTL exceeds the predetermined threshold Tth, for example, the controller 2 linearly adjusts the droop start current so that the value of the temperature detected by the temperature sensor SnsTL converges in a vicinity of the threshold Tth, as shown in FIG. 10A. This power saving control method is such that the output droop current value can be more appropriately adjusted in accordance with the state of the cooler or the load, because of which the energy balance can be further improved. Also, FIG. 10B shows a relationship between the cooler cooling water temperature and the output current when this power saving control method is adopted. The controller 2 can linearly change the droop start current in accordance with the value of the temperature detected by the temperature sensor SnsTL, because of which an optimum current can be output to the low voltage battery 13, without a part failing, even when the temperature of water entering the cooler of the power conversion device of the fourth embodiment is higher than that envisaged.

Another example of the power conversion device of the fourth embodiment is such that the output current is linearly controlled so that the temperature sensor value corresponds to a periphery of the threshold Tth, but not being limited to this, a multiple of droop start current values may be set, and the droop current values controlled step by step (multi-step control).

Fifth Embodiment

A power conversion device in a fifth embodiment will be described. A circuit configuration of the power conversion device in the fifth embodiment is the same as that in the first embodiment. With a precondition that the power conversion device of the fifth embodiment is water-cooled using a water cooling mechanism, the fifth embodiment relates to a failsafe control method in a case of a cooling abnormality when there is a water drainage state in which no cooling water enters the cooler.

The controller 2 includes a water drainage detecting mechanism, and when the controller 2 determines that there is a water drainage state (a cooler abnormality), the controller 2 sets the droop start current value to the third setting value Ic, which is smaller still than the droop start current value when carrying out power saving (the second setting value Ib). The output current value of the third setting value Ic is a current value that can be output within a range such that a part does not fail even when no water is flowing into the cooler.

Figure 11:
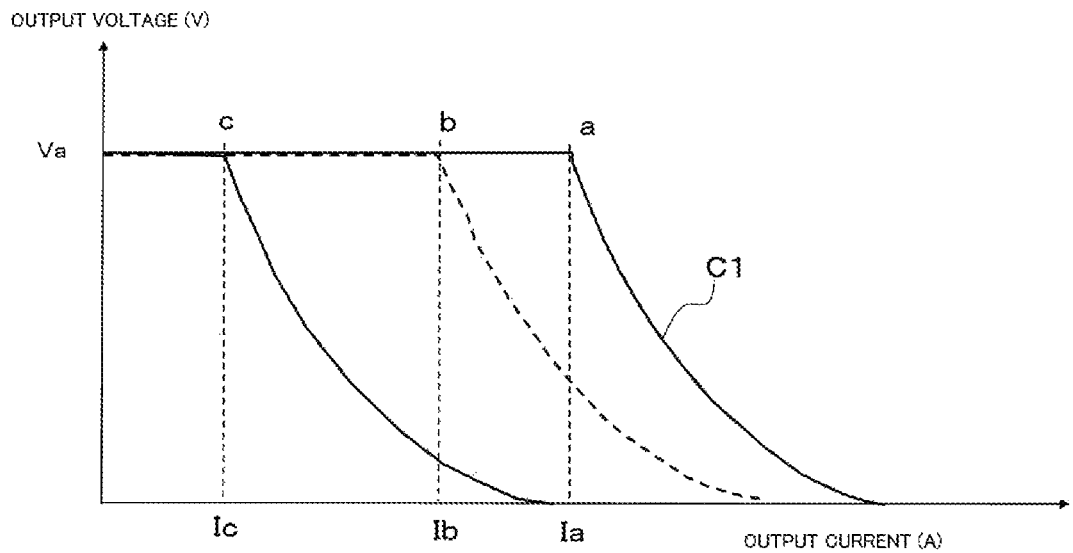
FIG. 11 is a drawing showing a relationship between the output voltage and the output current in a power conversion device according to a fifth embodiment of the present application.

A relationship between the output voltage and the output current at the time is shown in FIG. 11.

Normally, an operation is stopped when this kind of cooler abnormality occurs because there is a possibility of a part temperature exceeding a tolerable temperature, but when a user who is driving the vehicle continues to use an electronic part such as a low voltage system accessory (for example, an audio unit or air conditioning) without noticing anything, the battery deteriorates, and in the worst case, the battery is excessively discharged, and an electric instrument ceases to operate. Because of this, a power saving control method of the power conversion device according to the fifth embodiment is such that, provided that the DC-DC converter is normal, this kind of problem can be suppressed, enabling traveling to be continued and also leading to a limp home measure, by outputting even a little current to the low voltage battery 13, thereby charging the battery, even when the cooler is in an abnormal state such as water drainage.

Figure 12:
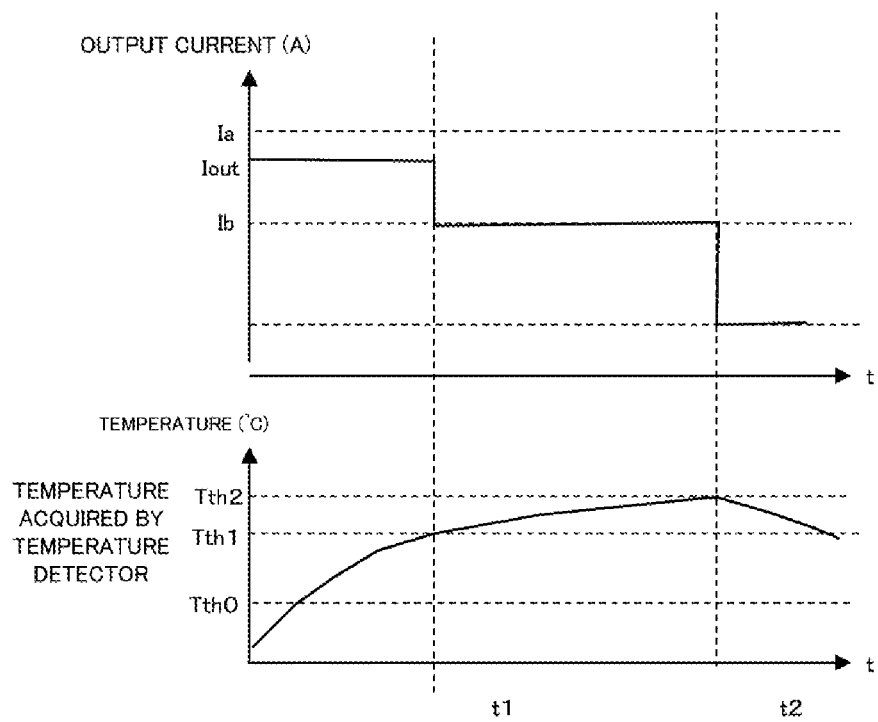
FIG. 12 is a drawing showing a time chart of the temperature sensor value and the output current in the power conversion device according to the fifth embodiment of the present application.

FIG. 12 shows a time chart of the output current and the temperature sensor in the power conversion device of the fifth embodiment. The power conversion device of the fifth embodiment is such that the controller 2 carries out power saving control and a determination of a water drainage detection in accordance with the value of the temperature detected by the temperature sensor SnsTL. In FIG. 12, firstly, it is assumed that water drainage has occurred at t=t0 when the output current Iout is equal to or greater than the second setting value Ib. At this time, the temperature of a part rises as cooling can no longer be carried out normally, and the value of the temperature of the part detected using the temperature sensor SnsTL also rises. Herein, when the temperature of the temperature sensor SnsTL reaches the first threshold Tth1, the controller 2 reduces the droop start current to the second setting value Ib in order to carry out power saving control (t=t1). Next, although a certain amount of cooling can be performed when the water temperature is simply high, the water draining away means that there is a practically a state of air cooling, and the temperature of the cooler is rising considerably. Because of this, the temperature of the part continues to rise even though the output current is limited to the second setting value Ib. Next, when the temperature of the temperature sensor SnsTL reaches the second threshold Tth2, the controller 2 determines that there is a water drainage state (a cooler abnormality), and the controller 2 lowers the droop start current to the third setting value Ic (t=t2).

The power conversion device according to this embodiment is such that the controller 2 determines that there is a cooler abnormality in accordance with the value of the temperature detected by the temperature sensor SnsTL, but not being limited to this, a cooling water situation may be acquired from an ECU (electronic controller) in an exterior of the power conversion device, for example, an ECU that is monitoring a cooling device such as a water pump, using a communication line of a CAN (controller area network) or the like. In this case, the controller 2 determines that there is a cooler abnormality based on a result of an external signal.

Also, as a method of determining that there is a cooler abnormality, the power conversion device may include a multiple of, for example, thermistors, which are the temperature sensor SnsTL, each temperature sensor may be provided with a function for power saving control or water drainage detection (cooler abnormality determination), and the controller 2 may determine that there is a cooler abnormality based on the value of the temperature detected by the temperature sensor for water drainage detection. In this case, by attaching the temperature sensor for water drainage detection to the part whose temperature is the highest when there is water drainage, an advantage is obtained in that power can be supplied as far as possible without stopping even when there is water drainage, in the same way as with the power conversion device of the fifth embodiment, in addition to which, an advantage is achieved in that detection accuracy and detection speed can be increased.

Figure 13:
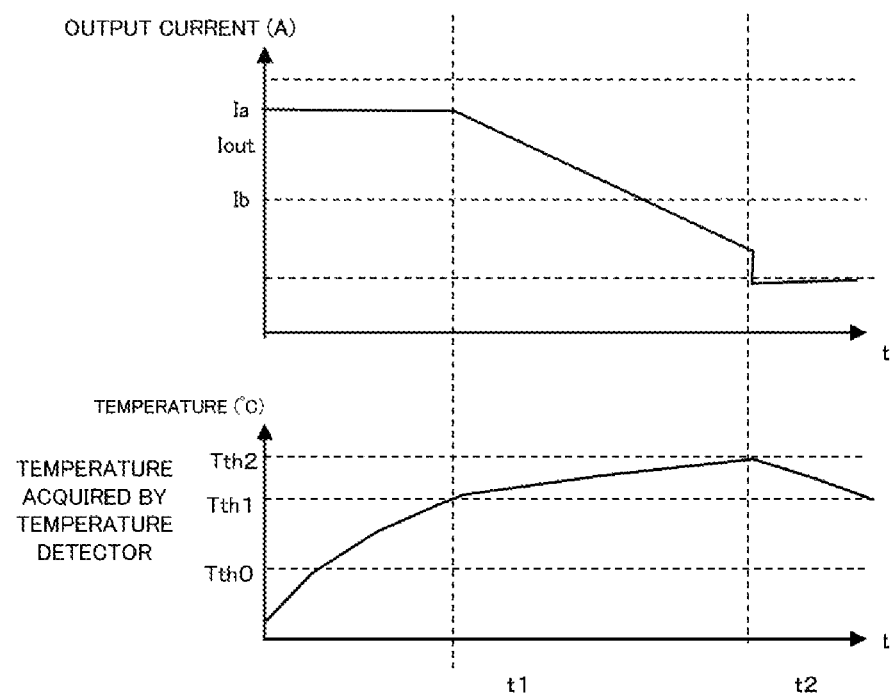
FIG. 13 is a drawing showing a time chart of the temperature sensor value and the output current in a modification of the power conversion device according to the fifth embodiment of the present application.

The power conversion device of the fifth embodiment is such that switching of the droop start current is a two-value control (the first setting value Ia and the second setting value Ib), but not being limited to this, power saving control such that the output current is reduced linearly with respect to the temperature sensor value, as described in, for example, the fourth embodiment, may be adopted. FIG. 13 shows a timing chart of the output current and the temperature sensor value in a modification of the power conversion device according to the fifth embodiment. FIG. 13 is an illustration wherein the controller 2 is restricting the output current because the temperature acquired from the temperature sensor SnsTL has exceeded the first threshold Tth1, but as cooling cannot be carried out in a state wherein water has drained away, the temperature continues to rise gently, and exceeds the second threshold Tth2. Because of this, the controller 2 determines that there is a cooler abnormality, and changes the droop start current to the third setting value Ic.

Sixth Embodiment

A power conversion device in a sixth embodiment will be described. A circuit configuration of the power conversion device in the sixth embodiment is the same as that in the first embodiment. With a precondition that the power conversion device of the sixth embodiment is water-cooled, the sixth embodiment relates to a failsafe control method in a case wherein the temperature sensor SnsTL fails (a power supply fault, a ground fault, or the like).

Figure 14:
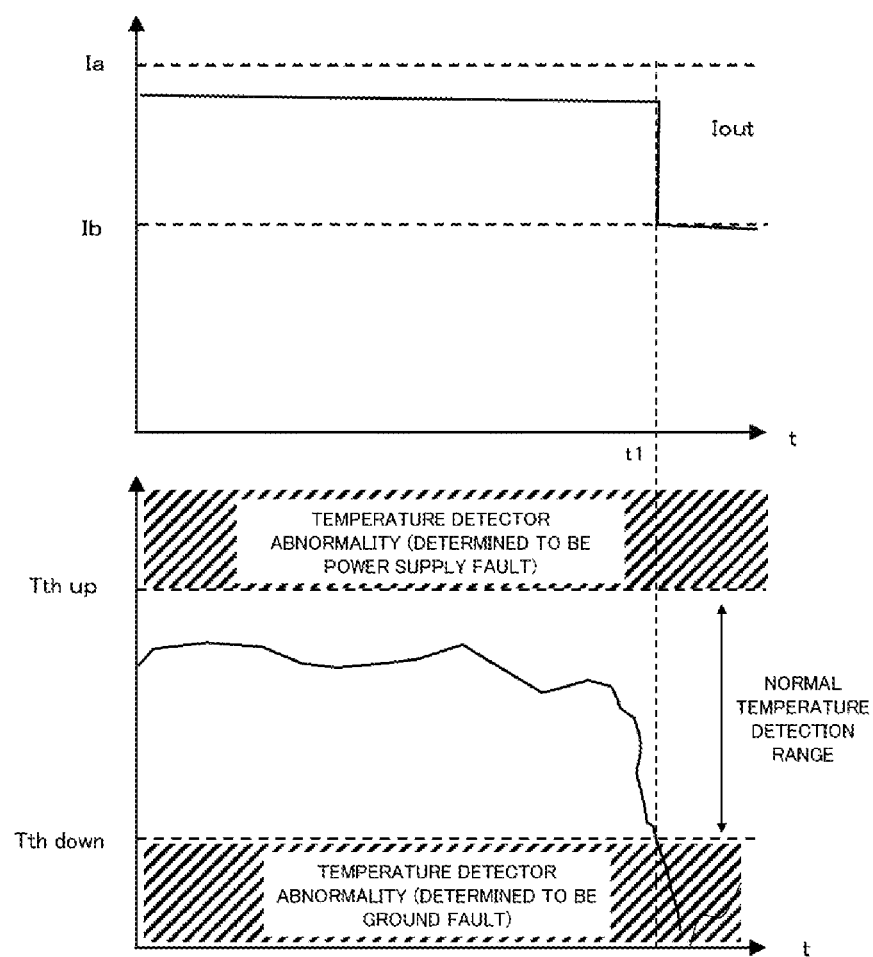
FIG. 14 is a drawing showing a time chart of the temperature sensor value and the output current in a power conversion device according to a sixth embodiment of the present application.

FIG. 14 is a timing chart of the output current and the temperature sensor illustrating a failsafe method when the temperature sensor SnsTL fails in the power conversion device according to the sixth embodiment. For example, the controller 2 acquires temperature information from an AD value that is the temperature acquired by the temperature sensor circuit converted into voltage (a digital value obtained by an A/D conversion of a voltage value indicated by a signal). For example, an AD value input into a microcomputer of the controller 2 is designed to be in a range of 0 to 5V, and as a power supply fault or ground fault detecting measure such that a failure of the temperature sensor circuit can be detected, a range of temperatures that can be acquired by the temperature sensor is designed to be a range of which an upper limit value is smaller than 5V and a lower limit value is 0V or greater, and the AD value of a temperature that comes within the predetermined range is within a normal range.

In FIG. 14, it is assumed that a ground fault has occurred in the temperature sensor circuit. As the AD value detected from the temperature sensor SnsTL has dropped below the predetermined range at t=t1, the controller 2 determines that the temperature sensor circuit has failed, and switches the droop start current to the second setting value Ib in order to limit the output current. Herein, the second setting value Ib represents an output current such that even when a high water temperature is input, a part can resist without failing.

By the heretofore described kind of failsafe control being carried out, a stable power can be supplied to the low voltage battery 13 without stopping, even when the temperature sensor circuit fails.

As a modification of the power conversion device according to the sixth embodiment, when the controller 2 includes a mechanism other than the temperature sensor SnsTL that can detect a water drainage (a cooler abnormality), for example, a detection via communication from an external ECU or a multiple of temperature sensors other than a temperature sensor for power saving, as described in the modification of the fifth embodiment, and determines that a water drainage (a cooler abnormality) has occurred in a situation wherein it has been determined that the temperature sensor circuit has failed and a control switching the output current to the second setting value Ib is being applied, the controller 2 switches the droop control start current value from the second setting value Ib to the third setting value Ic in order to further reduce the output current value (refer to FIG. 11).

Figure 15:
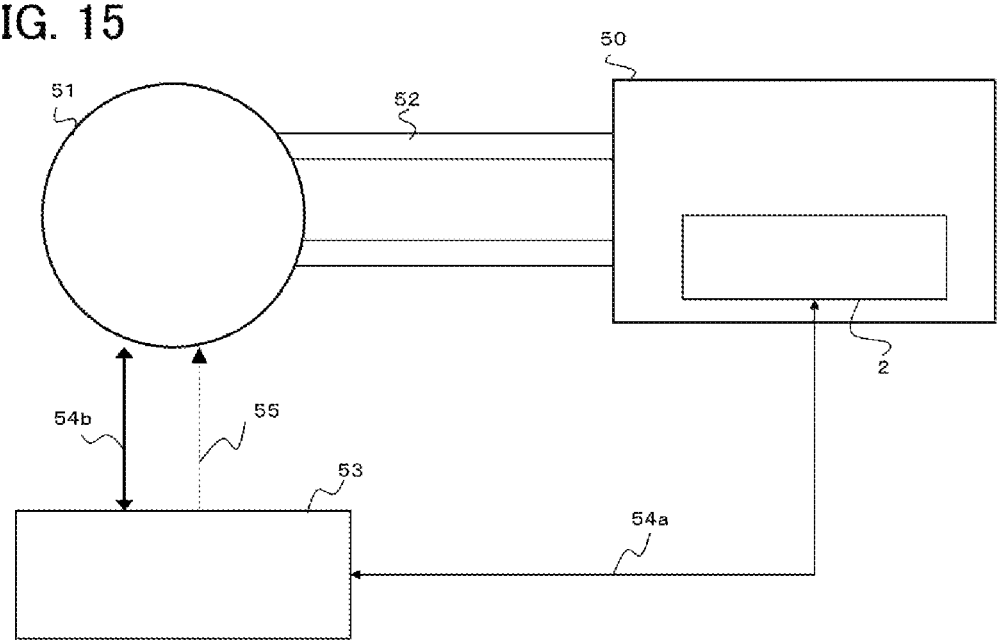
FIG. 15 is an illustration showing a cooling mechanism of the power conversion device according to the sixth embodiment of the present application.

The power conversion device according to the sixth embodiment is such that control is carried out so that the output current is restricted when the temperature sensor circuit fails, but it is conceivable that when a water pump that controls cooling water in order to cool an in-vehicle power conversion device or the like is intermittently driven, or the like, without being noticed, a part temperature will rise. Because of this, the power conversion device 50 according to the sixth embodiment is water-cooled, and cooling water is caused to circulate from an electric water pump 51 to the power conversion device 50 via a cooling pipe 52, as shown in FIG. 15. Herein, the controller 2 of the power conversion device 50 is connected via a communication line 54a to an external ECU 53 that controls the vehicle, and in the same way, the ECU 53 is connected via a communication line 54b to the electric water pump 51. The ECU 53, using a control line 55, issues a command signal to the electric water pump 51 commanding an output of a desired amount of water. Herein, a communication line is, for example, a CAN.

Herein, the power conversion device according to the sixth embodiment is such that when determining that the temperature sensor circuit has failed, the controller 2 reduces the output current, and also outputs a signal via the communication line 54a to the ECU 53 commanding an output of a predetermined flow amount or greater. In response to the information from the controller 2, the ECU 53 controls the electric water pump 51 so as to output the predetermined flow amount. Because of this, the power conversion device according to the sixth embodiment is such that a stable power can be supplied to the low voltage battery without stopping, even when the temperature sensor circuit fails.

Figure 16:
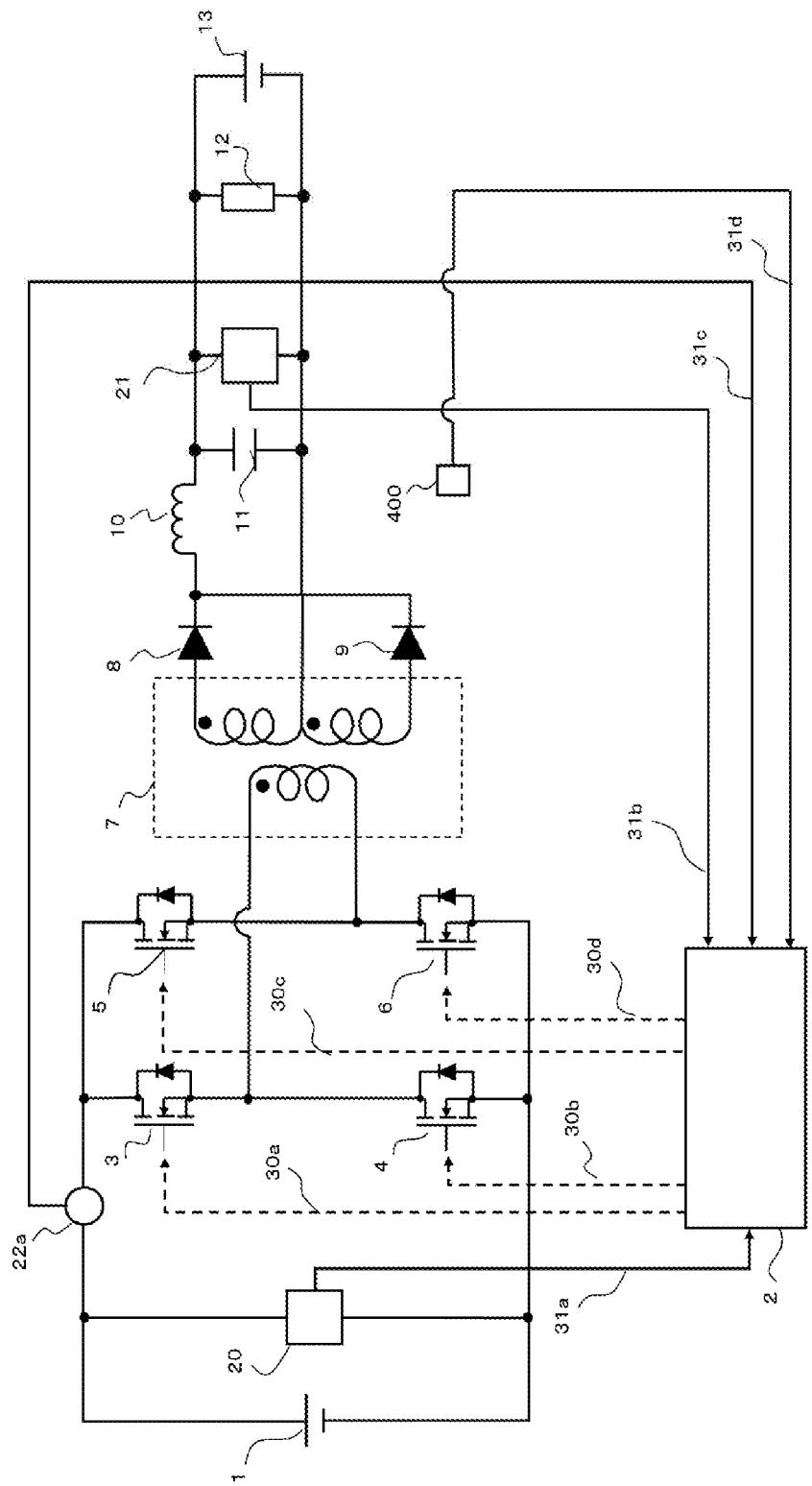
FIG. 16 is a schematic configuration diagram showing a modification of the power conversion device according to the first to sixth embodiments of the present application.

The power conversion device described in each embodiment is such that an output current value is detected by the current detector 22, but not being limited to this, for example, an input current detector 22a may be included on the primary side (the high voltage battery side), as shown in FIG. 16, and the output current estimated from the input current. In the case of a step-down converter, the input current is small in comparison with the output current, because of which a current sensor cost can be restricted further with this configuration.

The power conversion device described in each embodiment is such that the transformer of the DC-DC converter is shown as being of a center-tapped form, but not being limited to this, a configuration wherein both ends of the secondary side winding are connected to a center point of a full bridge diode may be adopted.

The power conversion device described in each embodiment is such that the rectifying circuit is described as a diode rectifier, but not being limited to this, for example, synchronous rectification may be adopted.

Also, the low voltage battery 13 described in each embodiment is a power storage device of a voltage lower than that of the high voltage battery 1, and not being particularly limited to a 12V battery, may be a 12V battery or a 24V battery, or a battery of another voltage.

The power conversion device according to the first embodiment is such that the DC-DC converter switching control method is hard switching, but not being limited to this, for example, a phase-shift control method may be adopted. In this case, the controller 2 controls the semiconductor switching element 3 and the semiconductor switching element 6 as one switching element pair, and controls by causing the phase of each semiconductor switching element 4 and 5 to deviate by a half-cycle (a 180° phase shift). A time chart of a signal and a current of each unit in this case is shown in FIG. 17.

Figure 17:
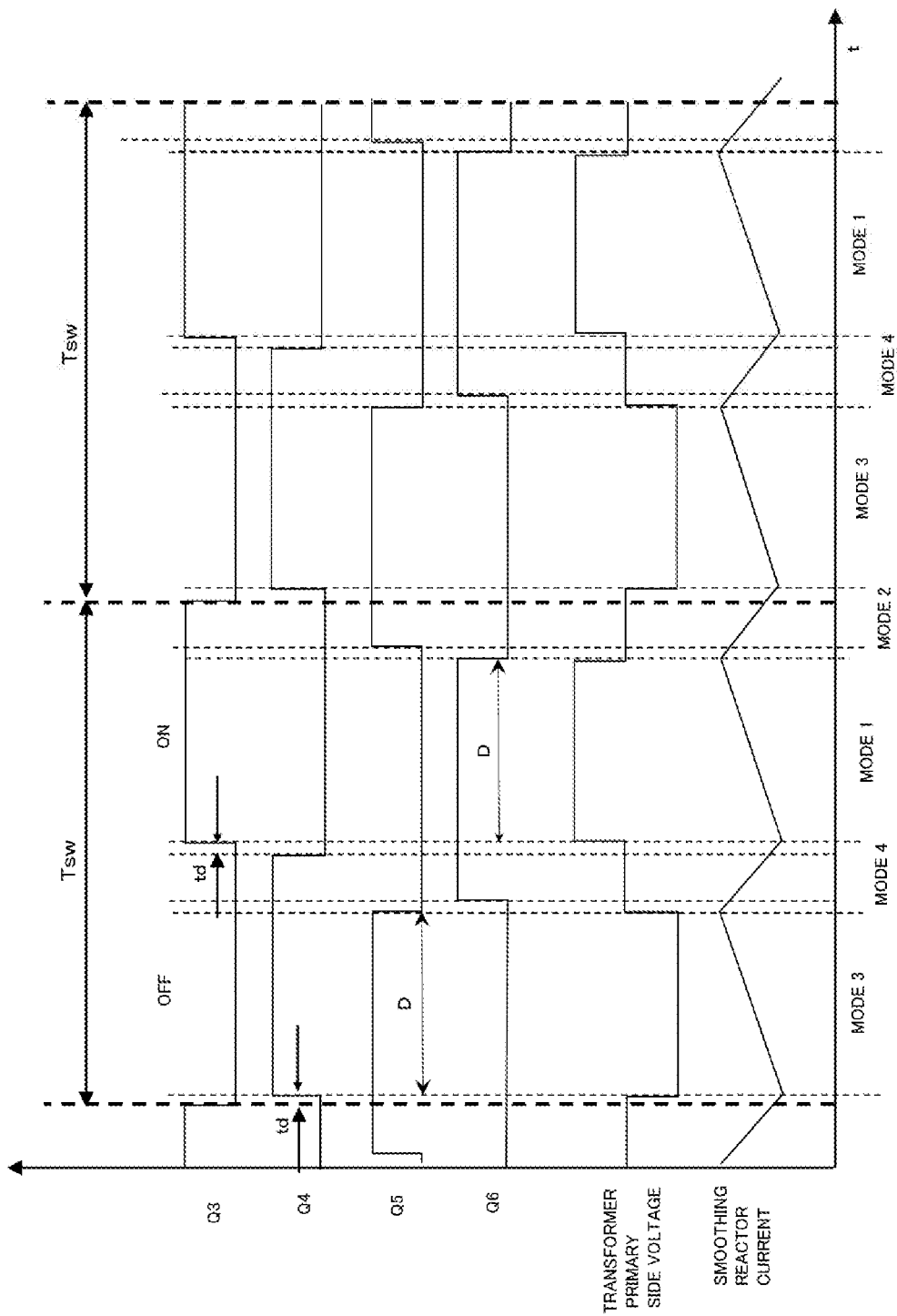
FIG. 17 is a drawing showing a time chart of a signal in each unit and a current showing a modification of the power conversion device according to the first embodiment of the present application.

As shown in FIG. 17, the semiconductor switching elements 3 and 4 and the semiconductor switching elements 5 and 6 are controlled so as to be turned on and off by providing a dead time td so that the upper and lower arms are not short-circuited.

Although the present application is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the embodiments.

It is therefore understood that numerous modifications that have not been exemplified can be devised without departing from the scope of the present application. For example, at least one of the constituent components may be modified, added, or eliminated, and furthermore, at least one of the constituent components may be selected and combined with the constituent components mentioned in another preferred embodiment.

REFERENCE SIGNS LIST high voltage battery, 2 controller, 3, 4, 5, 6 semiconductor switching element, 7 transformer, 8, 9 rectifying diode, 10 smoothing reactor, 11 smoothing capacitor, 12 load, 13 low voltage battery, 20 input voltage detector, 21 voltage detector, 22 current detector, 22a input current detector, 30a, 30b, 30c, 30d control line, 31a, 31b, 31c, 31d signal line, SnsT1 temperature sensor, power conversion device, 51 electric water pump, 52 cooling pipe, 53 external ECU, 54a, 54b communication line, 55 control line, 200 DC-DC converter, 210 processing device, 220 storage device, 221 table, 400 temperature detector

The invention claimed is:

1. A power conversion device, comprising:
a DC-DC converter that reduces and outputs an input power;
a current detector that detects a value of a current output by the DC-DC converter;
a temperature detector that detects a temperature of the DC-DC converter;
a controller that sets current values at which a control using droop characteristics is started in a plurality of stages in accordance with temperature values, respectively, and carries out the control by switching the current values in accordance with the temperature values detected by the temperature detector; and
a storage device that stores the current values at which the control is started,
wherein a water-cooling type cooling mechanism is used for cooling the power conversion device, and
wherein, based on determining a cooler abnormality in the water-cooling type cooling mechanism, the controller is configured to set the current value at which the control is started to a lowest setting value having a lowest current value among the stored current values.

2. The power conversion device according to claim 1, wherein the DC-DC converter is an insulated DC-DC converter including an insulated transformer including a primary winding and a secondary winding, a semiconductor switching element, and a rectifying circuit connected to the secondary winding of the insulated transformer, and the temperature detector detects a temperature of the rectifying circuit.

3. The power conversion device according to claim 2, wherein the rectifying circuit is where the most heat in the DC-DC converter is generated.

4. The power conversion device according to claim 1, wherein, when a value of the temperature detected by the temperature detector exceeds a first threshold, the controller switches the current value at which the control is started to a second setting value smaller than a first setting value and greater than the lowest setting value.

5. The power conversion device according to claim 4, wherein the controller provides a change speed of the output current of the DC-DC converter with a predetermined gradient when switching the current value from the first setting value to the second setting value.

6. The power conversion device according to claim 4, wherein the controller switches the current value to the second setting value, which is smaller than the first setting value, when an analog to digital (AD) value of the value of the temperature detected by the temperature detector exceeds a predetermined range.

7. The power conversion device according to claim 1, wherein, when the value of the temperature detected by the temperature detector exceeds a first threshold, the controller of the DC-DC converter controls the current value so that the value of the temperature converges to the first threshold.

8. A power conversion device comprising:
a DC-DC converter that reduces and outputs an input power;
a current detector that detects a value of a current output by the DC-DC converter;
a temperature detector that detects a temperature of the DC-DC converter; and
a controller that sets current values at which a control using droop characteristics is started in a plurality of stages in accordance with temperature values, respectively, and carries out the control by switching the current values in accordance with the temperature values detected by the temperature detector,
wherein the power conversion device has a water-cooling type cooling mechanism,
wherein, when a value of the temperature detected by the temperature detector exceeds a first threshold, the controller switches the current value at which the control is started to a second setting value smaller than a first setting value, and
wherein the controller includes, in an interior thereof, a cooler abnormality determinator that carries out a water drainage determination, and when the controller determines that there is a cooler abnormality, the controller switches the current value to a third setting value smaller than the second setting value.

9. The power conversion device according to claim 8, wherein the controller determines that there is a cooler abnormality when the value of the temperature exceeds a second threshold greater than the first threshold.

10. The power conversion device according to claim 8, further comprising:
a temperature detector for the water drainage determination,
wherein the controller determines that there is a cooler abnormality when a value of a temperature of the temperature detector for the water drainage determination exceeds a predetermined threshold.

11. The power conversion device according to claim 8, wherein the controller determines that there is a cooler abnormality when acquiring a water drainage detection signal from an electronic controller in an exterior of the power conversion device.

12. The power conversion device according to claim 8, wherein the controller_switches the current value to the third setting value when an analog to digital (AD)value of the value of the temperature detected by the temperature detector exceeds a predetermined range and the controller determines that there is a cooler abnormality.

13. A power conversion device comprising:
a DC-DC converter that reduces and outputs an input power;
a current detector that detects a value of a current output by the DC-DC converter;
a temperature detector that detects a temperature of the DC-DC converter; and
a controller that sets current values at which a control using droop characteristics is started in a plurality of stages in accordance with temperature values, respectively, and carries out the control by switching the current values in accordance with the temperature values detected by the temperature detector, wherein, when a value of the temperature detected by the temperature detector exceeds a first threshold, the controller switches the current value at which the control is started to a second setting value smaller than a first setting value, wherein the controller switches the current value to the second setting value, which is smaller than the first setting value, when an analog to digital (AD) value of the value of the temperature detected by the temperature detector exceeds a predetermined range, wherein the power conversion device has a water-cooling type cooling mechanism comprising, a water pump in an exterior of the power conversion device and an electronic controller that controls the water pump, and wherein the controller outputs a command signal to the electronic controller indicating that a flow amount of the water pump is to be a flow amount of a predetermined value or greater when the AD value of the value of the temperature detected by the temperature detector exceeds the predetermined range.

* * * * *